United States Patent
Bekele et al.

(10) Patent No.: US 8,614,599 B1
(45) Date of Patent: Dec. 24, 2013

(54) METHOD AND APPARATUS FOR POWERING DOWN A DUAL SUPPLY CURRENT SOURCE

(75) Inventors: Adebabay M. Bekele, San Jose, CA (US); Aman Sewani, Sunnyvale, CA (US); Xuewen Jiang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 153 days.

(21) Appl. No.: 12/963,154

(22) Filed: Dec. 8, 2010

(51) Int. Cl.
*H03K 17/687* (2006.01)
*G06F 1/32* (2006.01)
*G05F 1/46* (2006.01)

(52) U.S. Cl.
USPC ............. 327/546; 327/537; 327/543; 307/80; 307/85; 365/229

(58) Field of Classification Search
None
See application file for complete search history.

(56) References Cited

U.S. PATENT DOCUMENTS

| | | | | |
|---|---|---|---|---|
| 5,963,080 A * | 10/1999 | Miske et al. | ............... | 327/534 |
| 6,060,918 A * | 5/2000 | Tsuchida et al. | ............... | 327/143 |
| 6,259,275 B1 * | 7/2001 | Beiu | ............... | 326/112 |
| 6,426,614 B1 * | 7/2002 | Guthrie | ............... | 323/315 |
| 6,462,596 B1 * | 10/2002 | Varma | ............... | 327/218 |
| 7,355,455 B2 * | 4/2008 | Hidaka | ............... | 326/121 |
| 7,633,315 B2 * | 12/2009 | Yamaoka et al. | ............... | 326/112 |
| 7,698,525 B2 * | 4/2010 | Kumar | ............... | 711/170 |
| 7,716,609 B1 * | 5/2010 | Taheri | ............... | 716/135 |
| 7,746,162 B2 * | 6/2010 | Gouin | ............... | 327/538 |

* cited by examiner

*Primary Examiner* — Lincoln Donovan
*Assistant Examiner* — Terry L Englund
(74) *Attorney, Agent, or Firm* — Kin-Wah Tong; LeRoy D. Maunu; Lois D. Cartier

(57) ABSTRACT

One embodiment of an integrated circuit includes a local circuit block, a first power supply for supplying power to a first terminal of the local circuit block, a second power supply for supplying power to a second terminal of the local circuit block, a first transmission gate coupled between the second terminal of the local circuit block and a current path from the second power supply, and a second transmission gate coupled between the current path from the second power supply and a gate of a p-type metal-oxide-semiconductor (PMOS) transistor in the first transmission gate, the second transmission gate including a single transistor.

20 Claims, 4 Drawing Sheets

METHOD AND APPARATUS FOR POWERING DOWN A DUAL SUPPLY CURRENT SOURCE

FIELD OF THE DISCLOSURE

This disclosure relates generally to integrated circuits, and relates more particularly to powering down techniques for integrated circuits.

BACKGROUND

When a local circuit block of an integrated circuit is powered down, a very small reference current from a bandgap or a reference current generator often bleeds. FIG. 1, for example, is a schematic diagram illustrating a portion of an exemplary circuit 100 in which a small current bleed is present. Specifically, when the circuit 102 on the supply voltage (AVCC) domain is powered down, a small reference current (Ire) from the termination supply voltage (AVTT) domain bleeds constantly. Although this bleed of small current is insignificant when compared to the overall power consumption of the circuit 100, the trend toward lower power devices disfavors even a small current bleed.

Some designs are able to minimize current bleed during power down at the expense of performance in some process, voltage supply, and temperature corners. Other designs minimize the negative effects on certain process corners, but are less reliable. Still other designs improve reliability, but are susceptible to voltage drops and/or create noise which may adversely affect noise sensitive circuits.

SUMMARY

In one embodiment, a method and apparatus for powering down a dual supply current source are disclosed. One embodiment of an integrated circuit includes a local circuit block, a first power supply for supplying power to a first terminal of the local circuit block, a second power supply for supplying power to a second terminal of the local circuit block, a first transmission gate positioned between the second terminal and the second power supply, and a second transmission gate coupled to a current path from the second power supply, the second transmission gate including only a single transistor.

In various embodiments of the integrated circuit, the single transistor is a thick oxide device; the single transistor is a p-type metal-oxide-semiconductor (PMOS) transistor; the first transmission gate includes an n-type metal-oxide-semiconductor (NMOS) transistor and a p-type metal-oxide-semiconductor (PMOS) transistor positioned in parallel with the NMOS transistor, wherein an input at a gate of the NMOS transistor is complementary to an input at a gate of the PMOS transistor; at least one of the NMOS transistor or the PMOS transistor is a thin oxide device; the single transistor is positioned to pull the gate of the PMOS transistor of the first transmission gate during power down of the local circuit block and make a gate to source voltage of the PMOS transistor of the first transmission gate less than a threshold voltage of the PMOS transistor of the first transmission gate; a second transistor is positioned in series with the second transmission gate; the second transistor is a metal-oxide-semiconductor that is of a type that is an opposite of a type of the single transistor; the second transistor is an n-type metal-oxide-semiconductor (NMOS) transistor; the second transistor is positioned to pull a gate of a p-type metal-oxide-semiconductor (PMOS) transistor in the first transmission gate to ground during operation of the integrated circuit; the second power supply operates in a higher voltage than the first power supply; and/or the first power supply is a local power supply and the second power supply is a reference current power supply.

According to another embodiment, a method for powering down a local circuit block of an integrated circuit is provided. The method includes: receiving a signal to power down the local circuit block; and pulling a gate of a first transistor in a first transmission gate positioned between a second power supply terminal to the local circuit block and a second power to supply. The pulling of the gate of the first transistor makes a gate to source voltage of the first transistor less than a threshold voltage of the first transistor.

In various embodiments of the method, the first transistor is a p-type metal-oxide-semiconductor (PMOS) transistor that is positioned in parallel with an n-type metal-oxide-semiconductor (NMOS) transistor; the pulling is performed using a second transmission gate coupled to a current path from the second power supply; the second transmission gate comprises a single transistor; the single transistor is a metal-oxide-semiconductor transistor that is of a same type as the first transistor; the single transistor is a p-type metal-oxide-semiconductor (PMOS) transistor; and/or the single transistor comprises a thick oxide device.

According to another embodiment, a non-transitory computer-readable storage medium having stored thereon a plurality of instructions is provided. The plurality of instructions includes instructions which, when executed by a processor, cause the processor to perform steps of a method for powering down a local circuit block of an integrated circuit. The method includes: receiving a signal to power down the local circuit block; and pulling a gate of a first transistor in a first transmission gate positioned between a second power supply terminal to the local circuit block and a second power supply. The pulling of the gate of the first transistor makes a gate to source voltage of the first transistor less than a threshold voltage of the first transistor.

BRIEF DESCRIPTION OF THE DRAWINGS

Accompanying drawings show exemplary embodiments in accordance with one or more aspects of the disclosure. However, the accompanying drawings should not be taken to limit the disclosure to the embodiments shown, but are for explanation and understanding only.

DETAILED DESCRIPTION

The described embodiments reduce bleeding current to a negligible amount (e.g., less than approximately one nano-Amp) during power down of a local circuit block of an integrated circuit. Specifically, embodiments of the disclosure reduce bleeding current from a reference current generator to a negligible amount, which is in a higher power supply domain than the local circuit block, without compromising the performance or long-term reliability of the local circuit block.

Figure 1:
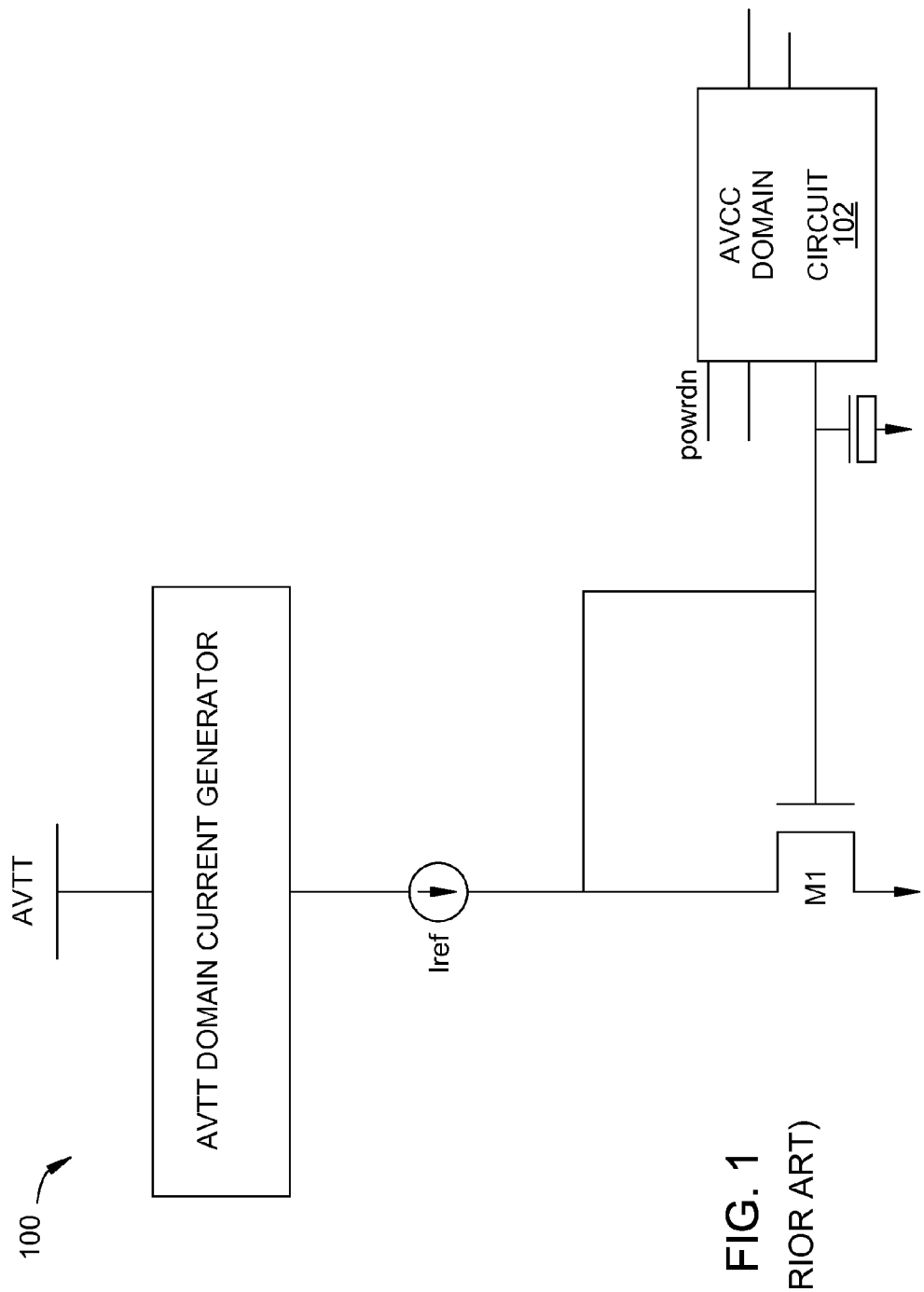
FIG. 1 is a schematic diagram illustrating an exemplary circuit in which a small current bleed is present.
Figure 2:
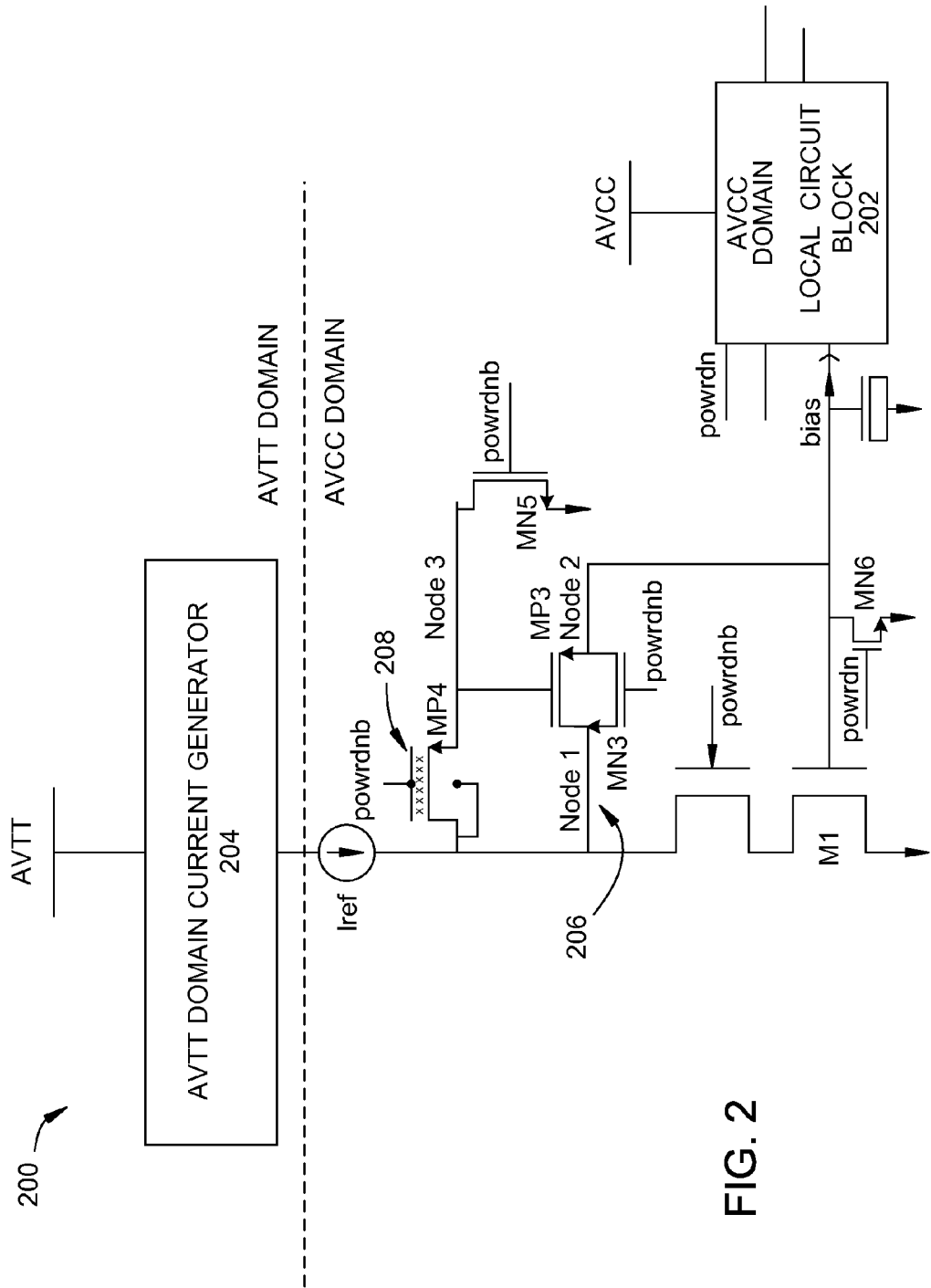
FIG. 2 is a schematic diagram illustrating a portion of one embodiment of an integrated circuit, in which bleeding current from a reference current generator is reduced to a negligible amount during power down of a local circuit block.

FIG. 2 is a schematic diagram illustrating a portion of one embodiment of an integrated circuit 200, in which bleeding current from a reference current generator 204 is reduced to a negligible amount during power down of a local circuit block 202. As illustrated, the integrated circuit 200 generally includes the local circuit block 202, which is powered at a first terminal by a first (e.g., AVCC) power supply and powered at a second terminal (i.e., bias terminal) by a second (e.g., AVTT) power supply. The first power supply is provided by a local power supply, while the second power supply is provided by the reference current generator 204. Thus, there is a dual supply of current for the local circuit block 202. In one embodiment, the second power supply operates in a higher voltage domain than the first power supply.

The integrated circuit 200 additionally includes a first transmission gate 206 and a second transmission gate 208. The first transmission gate 206 is coupled between the bias terminal of the local circuit block 202 and the current path from the reference current generator 204. The first transmission gate includes an n-type metal-oxide-semiconductor (NMOS) transistor (denoted by MN3) in parallel with a p-type metal-oxide-semiconductor (PMOS) transistor (denoted by MP3), with the input at the gate of the NMOS transistor being complementary to the input at the gate of the PMOS transistor. In one embodiment, both the NMOS transistor and the PMOS transistor are thin oxide devices (i.e., oxide devices that can only take approximately five percent more voltage stress above the local power supply voltage AVCC).

The second transmission gate 208 is coupled to the current path from the second power supply. In one embodiment, the second transmission gate comprises a single PMOS transistor (denoted by MP4). This single PMOS transistor is a thick oxide device (as indicated by the line of x's near the gate), which is capable of handling a higher threshold voltage and more voltage stress than a thin oxide device. In one embodiment, a thick oxide device can take approximately fifty percent more voltage stress above the local power supply voltage AVCC).

The second transmission gate 208 pulls the gate of the PMOS transistor MP3 in the first transmission gate 206 such that the gate to source voltage (Vgs) for the PMOS transistor MP3 is always less than the threshold voltage (Vt) for the PMOS transistor MP3 during power down of the local circuit block 202. In one embodiment, the voltage ground to source for the PMOS transistor MP3 is equal to the voltage of the second power supply (e.g., AVTT). This design not only reduces the bleed of reference current to a negligible amount during power down, but substantially eliminates the stress on the transistor M1. Thus, the long-term reliability of the integrated circuit 200 is not compromised.

In one embodiment, an additional NMOS transistor (denoted by MN5) can be positioned in series with the second transmission gate 208. The NMOS transistor MN5 pulls the gate of the PMOS transistor MP3 of the first transmission gate 206 to its lowest potential during normal operation of the integrated circuit 200. Additionally, an NMOS transistor (denoted by MN6) can be positioned between the first power supply and the second power supply, to turn off the transistor M1 in the current path from the second power supply during power down.

Figure 3:
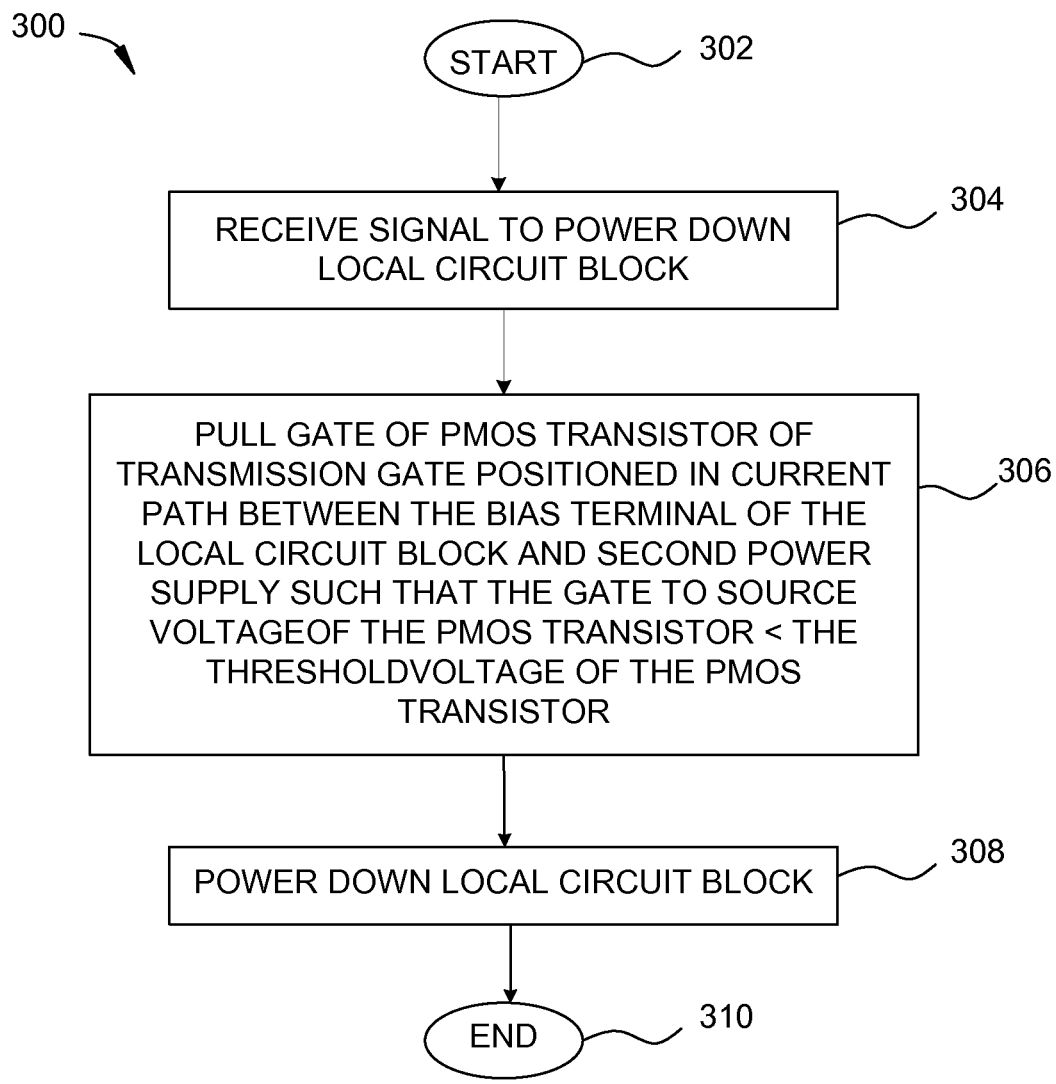
FIG. 3 is a flow diagram illustrating one embodiment of a method for minimizing bleeding current from a reference current generator during power down of a local circuit block.

FIG. 3 is a flow diagram illustrating one embodiment of a method 300 for reducing the bleeding current from a reference current generator to a negligible amount during power down of a local circuit block. The method 300 may be implemented, for example, in the integrated circuit illustrated in FIG. 2. As such, reference is made in the discussion of FIG. 3 to various elements of FIG. 2; however, this is not intended to imply that the method 300 cannot be implemented in integrated circuits having alternative configurations from that of FIG. 2.

The method 300 is initialized in step 302 and proceeds to step 304, where a signal is received to power down the local circuit block 202 (e.g., powerdn or powerdnb in FIG. 2). In response, the gate of the PMOS transistor MP3 of the first transmission gate 206 is pulled in step 306 such that the gate to source voltage, Vgs, of the PMOS transistor MP3 is less than the threshold voltage Vt of the PMOS transistor MP3. In one embodiment, the gate of the PMOS transistor MP3 is pulled using the second transmission gate 208, which comprises a single thick oxide PMOS transistor MP4.

The local circuit block 202 is then powered down in step 308. In step 310, the method 300 terminates.

Figure 4:
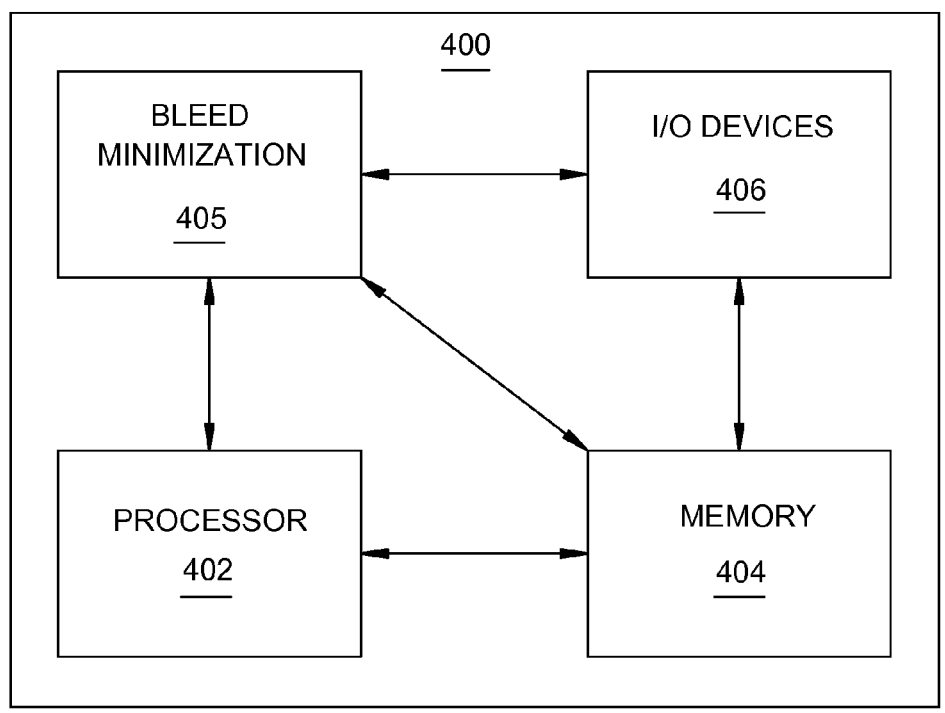
FIG. 4 is a high level block diagram of a general purpose computer or a computing device suitable for use in performing some or all of the functions described herein.

FIG. 4 is a high level block diagram of a general purpose computer, a computing device, or an integrated circuit device suitable for use in performing some or all of the functions described herein. The general purpose computer may incorporate, for example, an integrated circuit such as that illustrated in FIG. 2. As depicted in FIG. 4, the general purpose computer 400 comprises a processor element or processing elements 402 (e.g., a central processing unit (CPU)), a memory 404 (e.g., a random access memory (RAM) and/or a read only memory (ROM)), a bleed minimization module 405 for reducing bleeding current from a reference current generator to a negligible amount during power down of a local circuit block, and various input/output devices 406 (e.g., storage devices, including but not limited to a memory device, a tape drive, a floppy drive, a hard disk drive or a compact disk drive, a receiver, a transmitter, a speaker, a display, a speech synthesizer, an output port, an input port, output blocks or pads, input blocks or pads, and/or a user input device (such as a keyboard, a keypad, a mouse, and the like)).

The described embodiments can be implemented in a combination of software and hardware (e.g., using application specific integrated circuits (ASIC), a general purpose computer, one or more portions of a programmable logic device (PLD), or any other hardware equivalents such as microprocessors). In one embodiment, one or more steps of the present module or process for reducing the bleeding current from a reference current generator to a negligible amount during power down of a local circuit block may be loaded into memory 404 and executed by processor 402 to implement the functions as discussed above. As such, the present module or process 405 for reducing the bleeding current from a reference current generator to a negligible amount during power down of a local circuit block can be stored on a non-transitory (e.g., tangible or physical) computer readable storage medium or a storage device (e.g., RAM memory, magnetic or optical drive or diskette and the like).

It should be noted that although not explicitly specified, one or more steps of the method described herein may include a storing, displaying and/or outputting step as required for a particular application. In other words, any data, records, fields, and/or intermediate results discussed in the methods can be stored, displayed, and/or outputted to another device as required for a particular application.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. An integrated circuit, comprising:
    a local circuit block;
    a first power supply for supplying power to a first terminal of the local circuit block;
    a second power supply for supplying power to a second terminal of the local circuit block;
    a first transmission gate coupled between the second terminal of the local circuit block and a current path from the second power supply;
    a second transmission gate coupled between the current path from the second power supply and a gate of a p-type metal-oxide-semiconductor (PMOS) transistor in the first transmission gate, the second transmission gate comprising only a single transistor that is positioned to pull the gate of the p-type metal-oxide-semiconductor (PMOS) transistor in the first transmission gate when the local circuit block powers down, wherein a gate to source voltage of the PMOS transistor is less than a threshold voltage of the PMOS transistor during the power down; and
    a first transistor coupled in series between the current path from the second power supply and ground, wherein the first transistor decouples the current path from the second power supply from ground during the power down and couples the current path from the second power supply to ground during normal operation of the integrated circuit.

2. The integrated circuit of claim 1, wherein the single transistor is a thick oxide device.

3. The integrated circuit of claim 2, wherein the single transistor is a p-type metal-oxide-semiconductor (PMOS) transistor.

4. The integrated circuit of claim 2, wherein the first transmission gate comprises:
    an n-type metal-oxide-semiconductor (NMOS) transistor; and
    the PMOS transistor positioned in parallel with the NMOS transistor,
    wherein an input at a gate of the NMOS transistor is complementary to an input at the gate of the PMOS transistor.

5. The integrated circuit of claim 4, wherein at least one of: the NMOS transistor or the PMOS transistor is a thin oxide device.

6. The integrated circuit of claim 2, further comprising:
    a second transistor positioned in series with the second transmission gate.

7. The integrated circuit of claim 6, wherein the second transistor is a metal-oxide-semiconductor that is of a type that is an opposite of a type of the single transistor.

8. The integrated circuit of claim 6, wherein the second transistor is an n-type metal-oxide-semiconductor (NMOS) transistor.

9. The integrated circuit of claim 6, wherein the second transistor is positioned to pull the gate of the p-type metal-oxide-semiconductor (PMOS) transistor in the first transmission gate to ground during normal operation of the integrated circuit.

10. The integrated circuit of claim 1, wherein the second power supply operates in a higher voltage than the first power supply.

11. The integrated circuit of claim 10, wherein the first power supply is a local power supply and the second power supply is a reference current power supply.

12. The integrated circuit of claim 2, wherein the thick oxide device is thick relative to an oxide device comprising the PMOS transistor.

13. The integrated circuit of claim 2, wherein the single transistor is configured to handle more voltage stress than the PMOS transistor.

14. A method for powering down a local circuit block of an integrated circuit, the method comprising:
    receiving a signal to power down the local circuit block, the local circuit block having a first terminal coupled to receive power from a first power supply and a second terminal coupled to receive power from a second power supply;
    pulling a gate of a first transistor in a first transmission gate coupled between the second terminal of the local circuit block and a current path from the second power supply, wherein a gate to source voltage of the first transistor is less than a threshold voltage of the first transistor as the local circuit block powers down in response to the signal,
    wherein the pulling is performed using a second transmission gate coupled between the current path from the second power supply and the gate of the first transistor in the first transmission gate;
    decoupling the current path from the second power supply from ground in response to the signal to power down; and
    coupling the current path from the second power supply to ground in response to deassertion of the signal to power down.

15. The method of claim 14, wherein the second transmission gate comprises a single transistor.

16. The method of claim 15, wherein the single transistor is a metal-oxide-semiconductor transistor that is of a same type as the first transistor.

17. The method of claim 16, wherein the single transistor is a p-type metal-oxide-semiconductor (PMOS) transistor.

18. The method of claim 15, wherein the single transistor comprises a thick oxide device.

19. The method of claim 14, wherein the first transistor is a p-type metal-oxide-semiconductor (PMOS) transistor that is positioned in parallel with an n-type metal-oxide-semiconductor (NMOS) transistor.

20. A non-transitory computer-readable storage medium having stored thereon a plurality of instructions, the plurality of instructions including instructions which, when executed by a processor, cause the processor to perform a method for powering down a local circuit block of an integrated circuit, comprising:
    receiving a signal to power down the local circuit block, the local circuit block having a first terminal coupled to receive power from a first power supply and a second terminal coupled to receive power from a second power supply; and
    pulling a gate of a first transistor in a first transmission gate coupled between the second terminal of the local circuit block and a current path from the second power supply, wherein a gate to source voltage of the first transistor is less than a threshold voltage of the first transistor as the local circuit block powers down in response to the signal, wherein the pulling is performed using a second transmission gate coupled between the current path from the second power supply and the gate of the first transistor in the first transmission gate;

decoupling the current path from the second power supply from ground in response to the signal to power down; and coupling the current path from the second power supply to ground in response to deassertion of the signal to power down.

\* \* \* \* \*